United States Patent
Feng et al.

(10) Patent No.: US 7,245,127 B2
(45) Date of Patent: Jul. 17, 2007

(54) CERVICAL-THORACIC-LUMBAR SPINE PHASED ARRAY COIL FOR HORIZONTAL FIELD MRI SYSTEMS

(75) Inventors: Limin Feng, Streetsboro, OH (US); Karthik Lakshmanan, Streetsboro, OH (US); Jacob J. Sladkey, Burton, OH (US)

(73) Assignee: General Electric Company, Schenectady, NY (US)

( * ) Notice: Subject to any disclaimer, the term of this patent is extended or adjusted under 35 U.S.C. 154(b) by 93 days.

(21) Appl. No.: 10/993,557

(22) Filed: Nov. 19, 2004

(65) Prior Publication Data

US 2005/0122111 A1    Jun. 9, 2005

Related U.S. Application Data

(60) Provisional application No. 60/523,357, filed on Nov. 19, 2003.

(51) Int. Cl.
*G01V 3/00*    (2006.01)

(52) U.S. Cl. ..................................... 324/318

(58) Field of Classification Search ............... 324/318; 600/422
See application file for complete search history.

(56) References Cited

U.S. PATENT DOCUMENTS

| | | | |
|---|---|---|---|
| 6,414,485 B1 * | 7/2002 | Kato et al. | 324/307 |
| 6,441,612 B1 * | 8/2002 | Shimo et al. | 324/309 |
| 6,529,004 B1 * | 3/2003 | Young | 324/318 |
| 6,577,888 B1 * | 6/2003 | Chan et al. | 600/422 |
| 6,624,633 B1 * | 9/2003 | Zou et al. | 324/318 |
| 6,661,227 B2 * | 12/2003 | Eggers et al. | 324/307 |
| 6,701,177 B2 * | 3/2004 | Su | 600/422 |
| 6,930,481 B2 * | 8/2005 | Okamoto et al. | 324/318 |
| 2004/0196042 A1 * | 10/2004 | Fujita et al. | 324/318 |

\* cited by examiner

*Primary Examiner*—Brij Shrivastav
*Assistant Examiner*—Megann E Vaughn
(74) *Attorney, Agent, or Firm*—The Small Patent Law Group; Dean D. Small (57) ABSTRACT

A phased array coil for a Magnetic Resonance Imaging (MRI) system is provided that includes a first coil and a second coil adjacent the first coil. The first and second coils are configured in a shifted arrangement from a center of examination of the MRI system.

20 Claims, 7 Drawing Sheets

CERVICAL-THORACIC-LUMBAR SPINE PHASED ARRAY COIL FOR HORIZONTAL FIELD MRI SYSTEMS

CROSS REFERENCE TO RELATED APPLICATIONS

This application claims priority to and the benefit of the filing date of U.S. Provisional Application No. 60/523,357, filed on Nov. 19, 2003 and which is hereby incorporated by reference in its entirety.

BACKGROUND OF THE INVENTION

This invention relates generally to medical imaging systems, and more particularly, to a phased array coil for a Magnetic Resonance Imaging (MRI) system.

MRI or Nuclear Magnetic Resonance (NMR) imaging generally provides for the spatial discrimination of resonant interactions between Radio Frequency (RF) waves and nuclei in a magnetic field. NMR signals are typically detected using a receive RF coil, which is placed in the vicinity of a volume excited by the magnet system of the MRI or NMR scanner.

It is known to use a phased array configuration for RF coils in MRI to receive NMR signals. For example, a phased array surface coil for horizontal field MRI systems may include a surface phased array having multiple loop element coils. Any two adjacent loop elements typically have physical overlap in order to provide isolation. The multiple loop elements can be arranged, for example, in one row or in a triangle shape array.

Typically, a set of surface coil loops are critically decoupled relative to each other and simultaneously receive the NMR signal that is generated in the imaging region that is excited by a dedicated volume coil. The signal from these surface coils is then reconstructed to generate an image that is multiple times larger than the size of each individual loop in the array. Because the size of each element in the phased array is relatively small compared with the final reconstructed image, the noise figure is reduced and the signal obtained from each element of the phased array is increased. Thus, the final result is a significant increase in SNR for the final reconstructed image. The first application of such a phased array design was intended for the spine region because the required coverage of the spine area for the human body is extremely large and a single receive coil structure could not adequately provide the image necessary for clinical evaluation.

The use of these phased array coil structures, for example, a row of square loop coils for spine scanning when the coils are lined up in the head-foot (HF) direction, results in a shading problem with axial and coronal imaging. When a loop coil is used to scan the human body in a 3 T or higher field strength system, the sensitivity map of the coil in the transverse plane that is perpendicular to the main field direction of the system is not symmetrical. If the main field directs from the back of magnet to the front (patient end), the sensitivity map of the loop coil, which is put under the human body, tilts to left side (on the transverse plane, not the left side of the human body). If the main field direction reverses, the sensitivity map tilts to right side. Thus, if the left-right center of this phased array is positioned to the center of the spine, the coil does not provide the best SNR in the spine region because the coil sensitivity tilts to one side. The signals received from the right and left side of the spine are not symmetrically equal. The intensity difference between the signals from two symmetrical point on the left and right side of the spine can be more than twenty percent. This causes the transverse and coronal images of the coil to have obvious left-right shading.

Other variations use a two-dimension phased array surface coil structure having circular-shaped loop coils positioned adjacent loop coils at three apexes of an equilateral triangle. This structure is not suitable for spine imaging. When a phased array coil is used for spine imaging it should be able to scan any section of the spine. The coil should be made of several coil stations that are lined up in the HF direction. This triangle shape array is not suitable to make a spine coil with several coil sections in the HF direction.

Various modifications and deviations to the phased array coil were developed. For example, a phased array coil with figure "8" shaped element coils was developed and are which are commonly known as "butterflies." Instead of using a loop coil array, a quadrature coil array for spine imaging has also been provided. This coil is made of four quadrature pairs lined up in the HF direction with each quadrature pair having a loop and a butterfly element coil. This coil has several sections in the HF direction. Each section is made of one loop coil and a butterfly coil and they are quadrature analogically combined inside the coil or inside the MRI system. When a spine coil with this structure is used in 3 T system, the images generated by the coil also have left-right (LR) shading problems. This is because not only the loop coil, but also that butterfly coil has a tilted asymmetrical sensitivity map when used in a MRI system with 3 T or higher main field. The sensitivity map of the butterfly coil is shifted to the same direction as the loop coil because the field inside the human body generated by the two wings of the butterfly coil are not symmetrical. The sensitivity map looks like two mountain peaks and the peak on the side to which the field tilts is higher than the other side. Thus, the signals received by the loop and butterfly coil quadrature analogically combined field still show an asymmetrical pattern. The best SNR area of this coil is not in the center where the spine lies, but shifts to one side. For example, one of the images on one side of the kidney is brighter than the other side.

Other coil arrays are also known that include six quadrature pairs. The six pairs are aligned in the HF direction to cover the whole Cervical-Thoracic-Lumbar (CTL) spine area. The first pair may be positioned on a former that is conformal to the human neck. The quadrature pairs can be used separately or jointly to image any desirable section of the spine. Two elements in each pair are either quadrature analogically combined or digitally combined depending on how many receive channels are in the MRI system.

In order to enhance the ability to image the CTL spine area, a phased array design was proposed that covered the intended area. The proposed design included six quadrature pairs (six loop and six saddle coils in a quadrature configuration) separated in a multiple list of modes in which the coil can operate and further can image any desirable section of the spine. These coils have six quadrature pairs lined up in HF direction. The first pair that covers the neck is put on the former with a conformal shape to the neck. The butterfly coil of this quadrature pair looks more like a saddle coil. All the quadrature pairs in coils are either analogically combined inside the coil or digitally combined in the system. The sensitivity map of a saddle coil also has an asymmetrical pattern. Because both two element coils of a quadrature pair have asymmetrical sensitivity, the digitally combined images still have the LR shading problem. Thus, when a coil with this structure is used in a system with 3 T or higher main field, it still has the left and right shading problem no matter whether it is analogically combined or digitally combined. An alternative embodiment is to use twelve elements independently or in any receiver configuration based on the MRI system. This system still has the LR shading problem.

Thus, in operation, when a surface coil (e.g., a loop coil) is used in high field MRI systems whose main magnetic field strength is 1.5 Tesla (T) or higher, an asymmetrical signal sensitivity of the coil is observed. Even though the loop coil has a symmetrical structure, the sensitivity map of the coil tilts to one side. The tilting direction is related to the direction of the main magnetic field. This phenomenon is more obvious in a system that has the main magnetic field strength equal or higher than 3 T. This phenomenon is caused by the dielectric and conductive effect of the human body on the high RF frequency electromagnetic field. The RF electromagnetic field generated by nuclei resonant spins inside the body is a circular polarized field and propagates inside the body because the electromagnetic wavelength inside the body is not much larger than the dimension of the body at high RF frequency. The MR signals received by the coil from the left and the right side are no longer equal because of propagation of the circular polarized field generated by nuclei resonant spins.

When a traditional spine coil (e.g., CTL coil) with the quadrature structure described above is used in a 3 T system, the coil sensitivity map is tilted to one side. For example, on transverse and coronal spine images, the signals of tissues on the left and right sides of the spine are not equal. The difference of the signal intensity on the two sides can cause LR shading on the transverse and coronal spine images. This is known as LR shading problem for spine imaging with the traditional CTL coil. This problem may result in an improper or failed diagnosis.

Further developments in MRI include Simultaneous Acquisition of Spatial Harmonics (SMASH) that use a parallel processing algorithm to exploit spatial information inherent in a surface coil array. The result is an increase in MR image acquisition speed, resolution and/or field of view. In a similar fashion, another parallel processing algorithm is known where the acceleration of image acquisition is performed on the time domain space instead of the frequency domain space. This parallel acquisition technique is referred to as Sensitivity Encoding (SENSE). In SENSE, images are obtained by means of magnetic resonance (MR) of an object placed in a static magnetic field and includes simultaneous measurement of a number of sets of MR signals by application gradients and an array of receiver coils. Reconstruction may bee provided from a number of receiver coil images from the sets of MR signals measured and/or reconstruction of a final image may be from a distant dependent sensitivity of the receiver coils and a first plurality of receiver coil images.

The characteristics of all of these parallel imaging techniques is that the acceleration speed is directly proportional to the number of independent receivers along the direction that the image acceleration needs to be applied. Thus, the higher the number of receiver coils, the faster the acceleration speed for acquiring an image with better SNR and improved image quality.

However, if the phased array surface coil has one row of square loop coils, it only has parallel imaging capability in the HF direction. Further, the quadrature phased arrays described above also only have parallel imaging capability in the HF direction. The two element coils of a quadrature pair in these coils have a large common coverage in the LR direction. The g-factor values for such a quadrature coil are severely elevated because the $B_1$ field profile for these two element coils is nearly indistinguishable around the spine region. Thus, they have no parallel imaging capability in the LF direction.

BRIEF DESCRIPTION OF THE INVENTION

In an exemplary embodiment, a phased array coil for a Magnetic Resonance Imaging (MRI) system is provided that includes a first coil and a second coil adjacent the first coil. The first and second coils are configured in a shifted arrangement from a center of examination of the MRI system.

In another exemplary embodiment, a cervical-thoracic-lumbar (CTL) spine phased array coil for a Magnetic Resonance Imaging (MRI) system is provided that includes a plurality of coil sections aligned in a head-foot direction of the MRI system. Each of the coil sections includes at least two coils configured in a parallel arrangement in a left-right direction of the MRI system. The at least two coils of each coil section are shifted from a center of the left-right direction.

In yet another exemplary embodiment, a method of providing a phased array coil is provided that includes configuring at least two coils in each of a plurality of coil sections in a parallel arrangement in a left-right direction of the MRI system. The method further includes shifting the at least two coils in each of the plurality of coil sections from a center of the left-right direction.

DETAILED DESCRIPTION OF THE INVENTION

Various embodiments of the present invention provide a Magnetic Resonance Imaging (MRI) phased array coil for imaging, for example, the Cervical-Thoracic-Lumbar (CTL) spine of the human body. The various embodiments may be used in a horizontal MRI system with, for example, a 3-Telsa (3 T) main magnetic field strength. However, the various embodiments may be used in MRI systems having a lower or greater main magnetic field strength. The human body's dielectric and conductive effect on the high frequency electromagnetic field, causes the RF coil with a symmetrical structure to receive asymmetrical signals from the body. This causes, for example, the spine images made by the traditional CTL coil, which has a symmetrical quadrature pair structure, to have left-right (LR) shading. Various embodiments of the invention provide one or more two-loop coil structures to provide a uniform sensitivity area with a high SNR in the LR direction to cover the spine and nearby tissue. The various embodiments also provide a coil array having parallel imaging capability with phase encoding in the LR direction.

Figure 1:
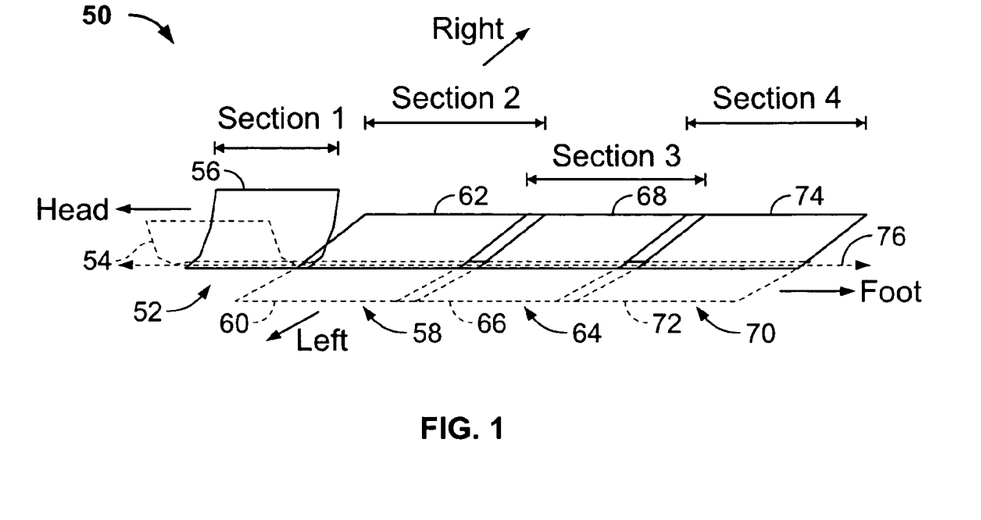
FIG. 1 is a schematic representation of a phased array coil in accordance with an exemplary embodiment of the invention.
Figure 2:
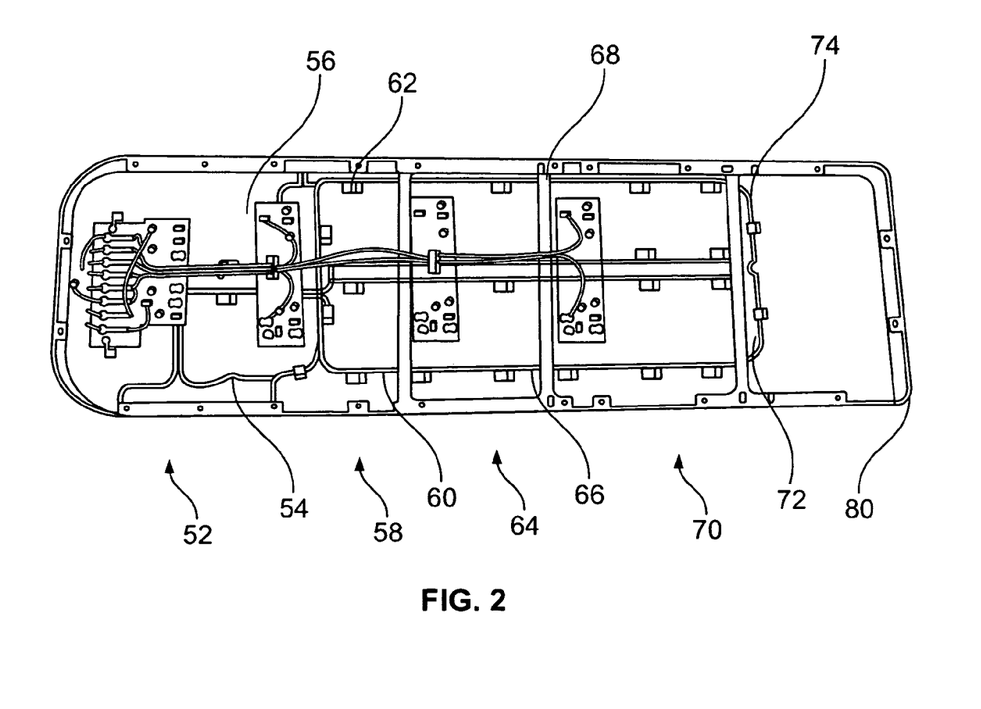
FIG. 2 is a perspective view of a phased array coil within a posterior former in accordance with an exemplary embodiment of the invention.

More particularly, and as shown in FIG. 1, in an exemplary embodiment, a phased array coil 50, for example, a CTL phased array coil, generally includes a plurality of coil elements, such as, eight loop coil elements arranged in four sections aligned in the head-foot (HF) direction. For example, the four sections in one exemplary embodiment are aligned longitudinally for imaging along a spine of a patient. Specifically, a first coil section 52, which may be positioned toward a patient's head, includes a first loop coil 54 and a second loop coil 56. A second coil section 58 adjacent the first coil section 52 includes a third loop coil 60 and a fourth loop coil 62. A third coil section 64 adjacent the second coil section 58 includes a fifth loop coil 66 and a sixth loop coil 68. A fourth coil section 70 adjacent the third coil section 64, and which may be positioned toward a patient's feet, includes a seventh loop coil 72 and an eighth loop coil 74. The two loop coils in each of the coil sections 52, 58, 64 and 70 are configured in a parallel arrangement positioned in the left-right (LR) direction. The LR center 76 of the two loop elements in each of coil sections 52, 58, 64 and 70 is shifted or offset from the center of examination (e.g., shifted from the center of a patient or patient's spine to be examined). For example, the LR center 76 may be shifted from an LR center of a coil former 80 (posterior former shown) as shown in FIG. 2.

Figure 3:
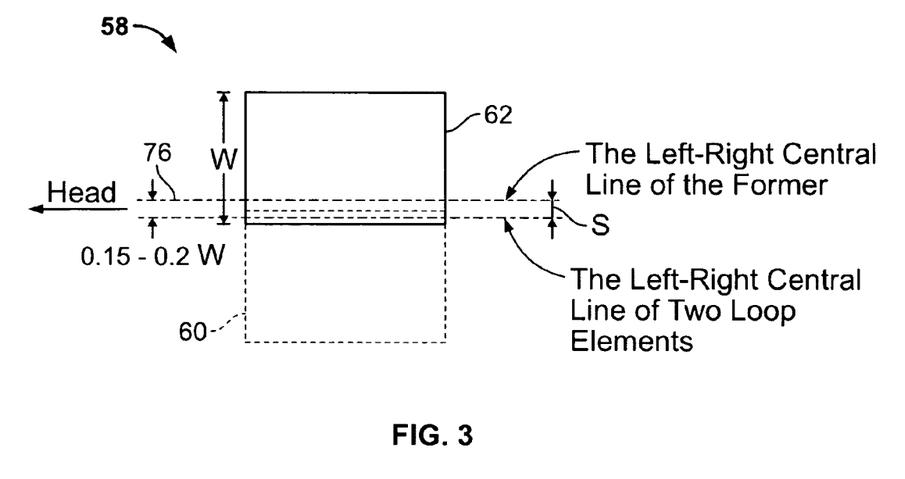
FIG. 3 is a schematic representation of two coils of a phased array coil in a shifted arrangement in accordance with an exemplary embodiment of the invention.
Figure 4:
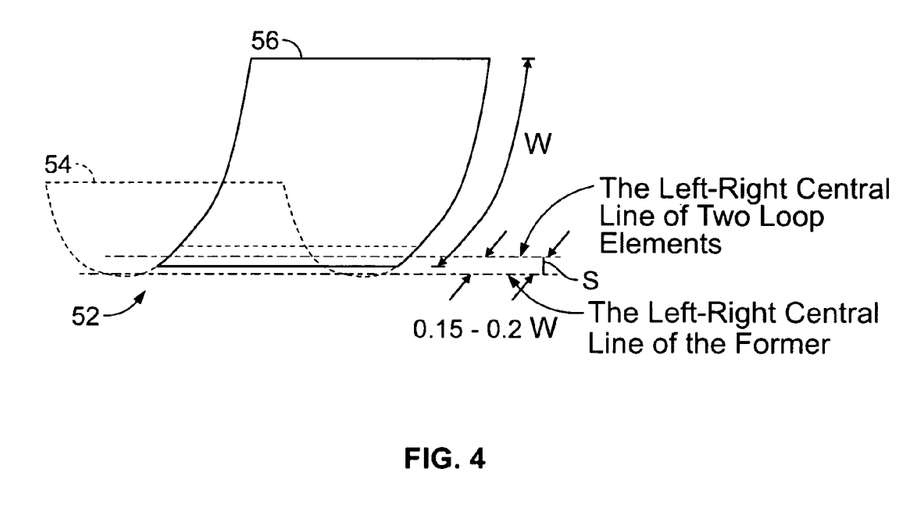
FIG. 4 is a schematic representation of two coils of a phased array coil in a shifted arrangement in accordance with another exemplary embodiment of the invention.

As shown in FIG. 3, the shift of the coils (represented by S), for example, the third and fourth loop coils 60 and 62, may be either to the left or right of the LR center 76 and may be, for example, about fifteen percent to about twenty percent of the width of the loop coil 60 or 62. However, this shift may be larger or smaller as desired or needed (e.g., based on the imaging application or MRI system). It should be noted that the same shift is provided to all loops or loop pairs in each section of the phased array coil 50. The shifting direction depends on the direction of the main field of the MRI system (not shown). If the main field directs from the back to the front (patient end) of the magnet, the coils are shifted to right side. If the main field reverses, the coils are shifted to the left side. Further, it should be noted that in an exemplary embodiment, the loop coils 54 and 56 of the first coil section 52 may be configured to be conformal to the shape of the neck and head are likewise shifted to the left or right, for example, around the neck, about fifteen percent to about twenty percent of the width of the loop coils 54 and 56 as shown in FIG. 4.

Figure 5:
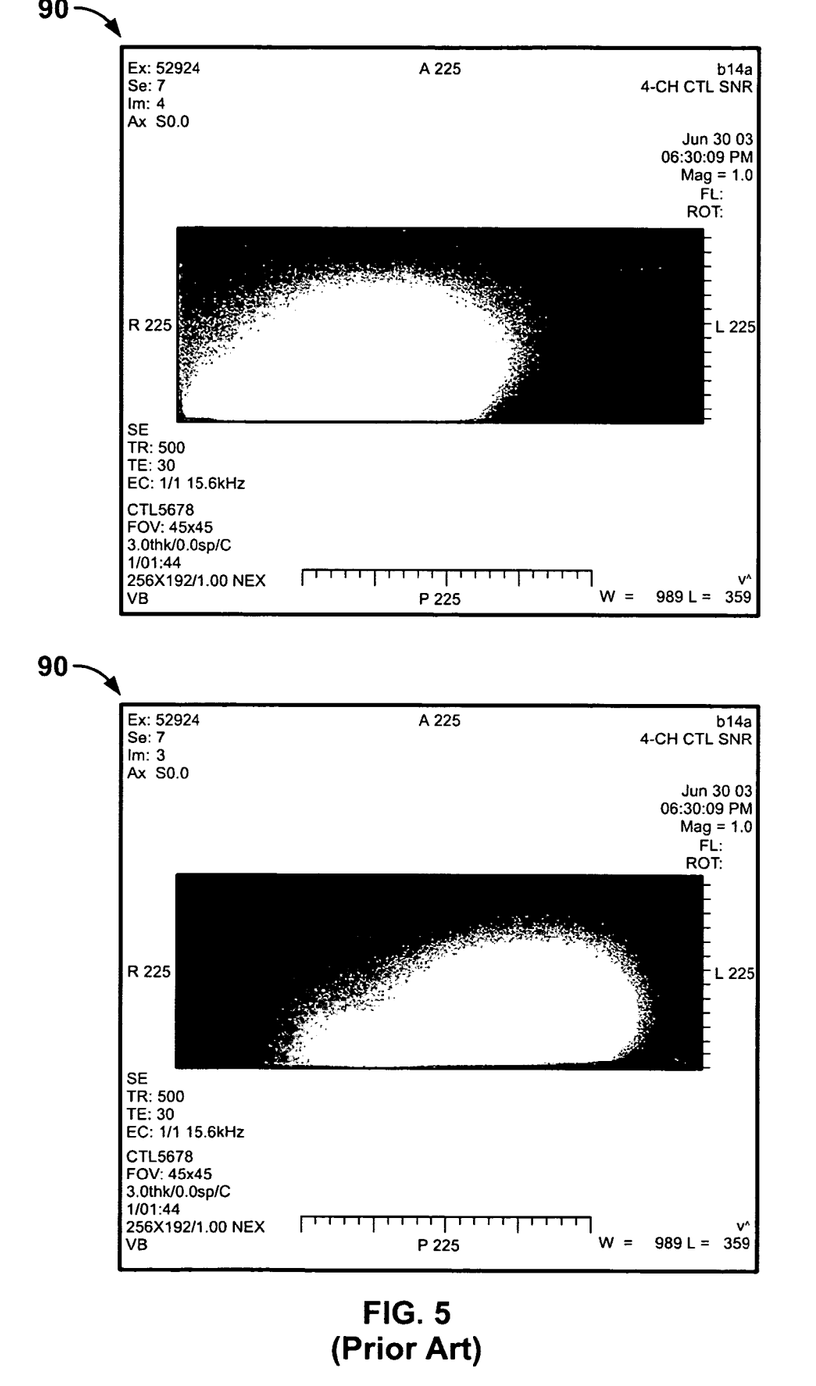
FIG. 5 are images of a sensitivity map for a typical loop coil showing a tilted image.
Figure 6:
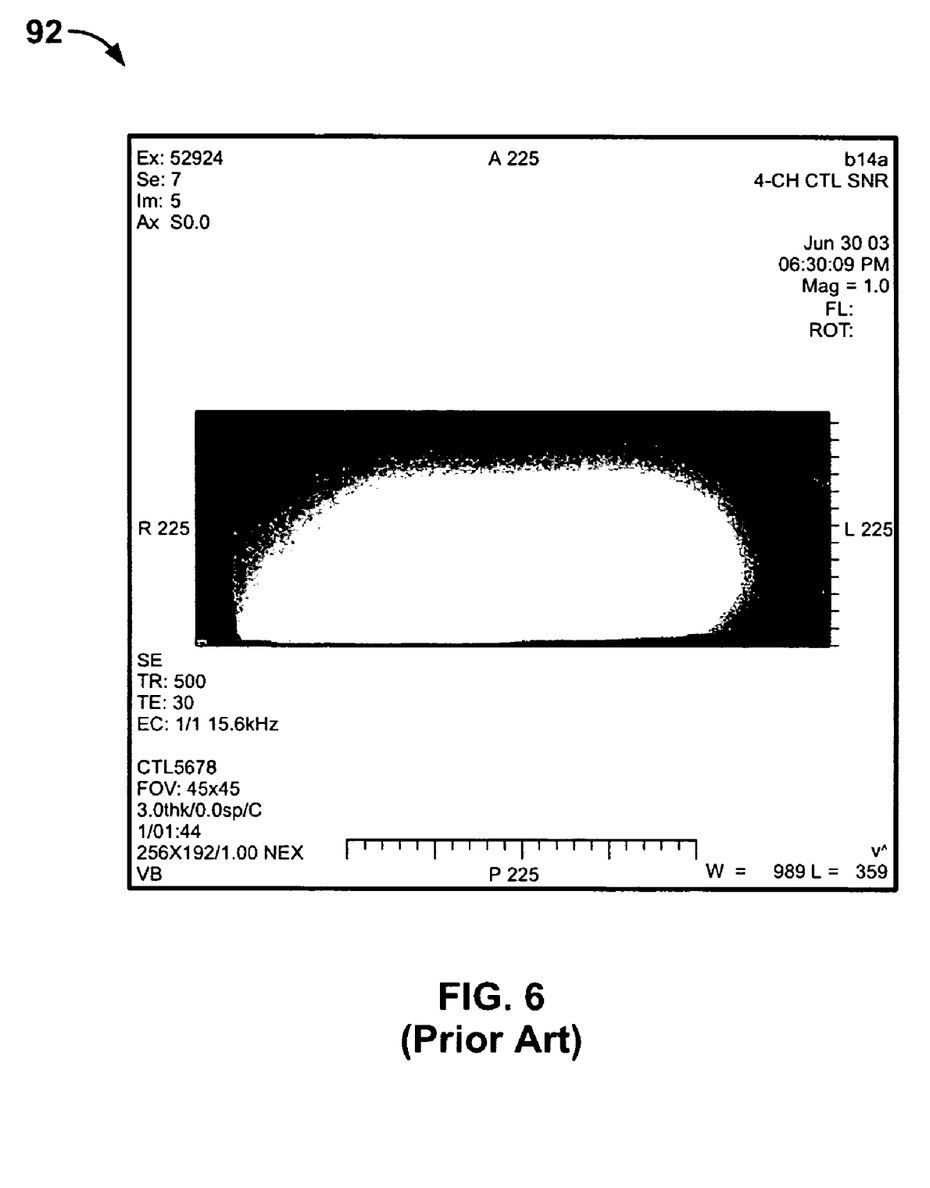
FIG. 6 is an image of a combined sensitivity map for a typical loop coil showing a tilted image.

The loop coils in each coil section 52, 58, 64 and 70 are overlapped to provide isolation between the two coil elements, but also provide a wide uniform field in LR direction and high SNR in the center of these two coil elements. In operation, a coil with non-overlapping loop elements has low g factors, which is good for parallel imaging, but has lower SNR in the center area where the spine lies compared to a coil with overlapping loop elements. The sensitivity map combined from two overlapping two loop elements are flat in a wide area. For example, a sensitivity map 90 of a typical single loop coil is shown by the phantom image of the single loop coil in FIG. 5. FIG. 6 is a combined sensitivity map 92 of a typical single loop coil shown by the phantom image of two loop coils. Because the sensitivity map 90 of the single loop element is tilted, the sensitivity map 92 combined from two loop elements is still tilted. Thus, various embodiments of the present invention provide for positioning the spine in the center of the coil coverage, which is provided by shifting the center of the phased array coil 50 as described herein.

In operation, considering penetration and SNR of a loop coil for spine imaging, the width of the loop coil cannot be too wide or two narrow. A typical width is about fifteen centimeters (cm). Using coils with this width, various embodiments of the invention provide a shifting distance about two cm to about three cm, which is about fifteen percent to about twenty percent of the width of the coil and positions the spine in the center of the uniform sensitivity area of the coil.

Adjacent coil sections 52, 58, 64 and 70 are also overlapped in order to provide isolation between adjacent loop coils in the coil sections 52, 58, 64 and 70. Because the magnetic field in the Z direction of the loop coils does not receive a MR signal, there is a dip middle of two adjacent sections on the sagittal sensitivity map of the coil. Overlapping coil sections can decrease the dip, thus increasing SNR in the middle of two adjacent sections.

The phased array coil 50 may be used, for example, in connection with a four-receive-channel MRI system. In operation, the first and second coil sections 52 and 58 may be used to the scan the cervical spine (C-spine) and part of the thoracic spine (T-spine). The second and third coil sections 58 and 64 may be used to scan the thoracic spine. The third and fourth coil sections 64 and 70 may be used to scan the lumbar (L-spine) and a part of thoracic spine. It should be noted that any of the coil sections 52, 58, 64 and 70 also may be used to scan a small specific part of the spine. In operation, two loop coils of each section 52, 58, 64 or 70 are used at the same time in order to provide uniform and symmetrical images in the LR direction. Each loop element is digitally combined with other loop elements inside the MRI system as is known.

Figure 7:
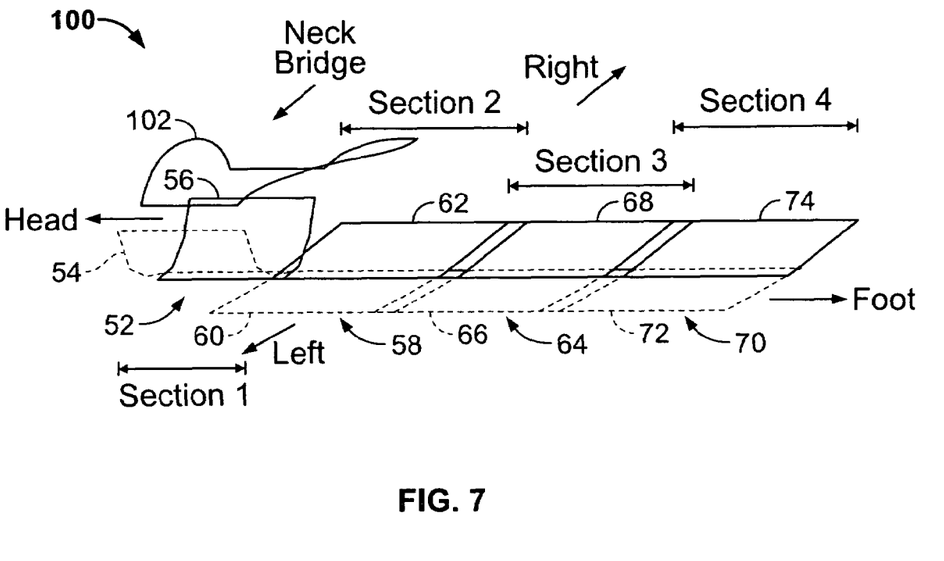
FIG. 7 is a schematic representation of a phased array coil in accordance with another exemplary embodiment of the invention.

Different phased array coils may be provided by various embodiments of the invention. In another exemplary embodiment, as shown in FIG. 7, a phased array coil 100 with eight loop coils similar to the a phased array coil 50 may be provided, for example, on a posterior former, with the addition of one loop coil 102 on the neck bridge (not shown). The loop coil 102 enhances penetration in the C-spine area. This phased array coil 100 also may be used in connection with a four channel MRI system. In such as system, the two loop coils 54 and 56 of first coil section 52 are quadrature analogically combined inside the coil. Thus, the first and second coil sections 52 and 58 may be used in combination with the loop coil 102 of the neck bridge for C-spine scanning.

Figure 8:
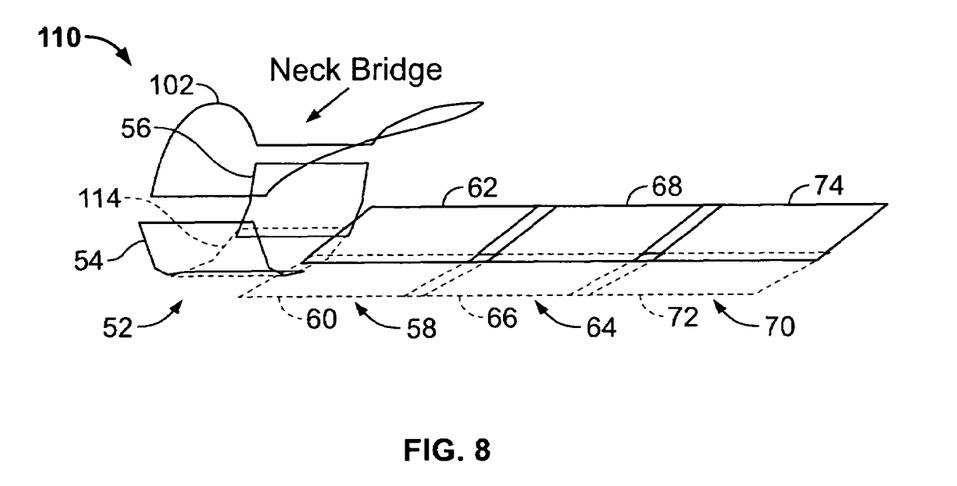
FIG. 8 is a schematic representation of a phased array coil in accordance with another exemplary embodiment of the invention.

In another exemplary embodiment, as shown in FIG. 8, a phased array coil 110 with nine loop coils, for example, on the posterior former and one loop coil on the bridge, is provided. This phased array coil 110 provides a ninth loop coil 114 in the first section 52, for example, between the two loop coils 54 and 56 in the LR direction. The three loop coils in the first coil section 52 provides a high SNR in the C-spine area. The phased array coil 110 may be used in connection with a four channel MRI system. In such a system, the three loop coils 54, 56 and 114 in the first coil section 52 and the loop coil 102 are used for C-spine scanning.

Figure 9:
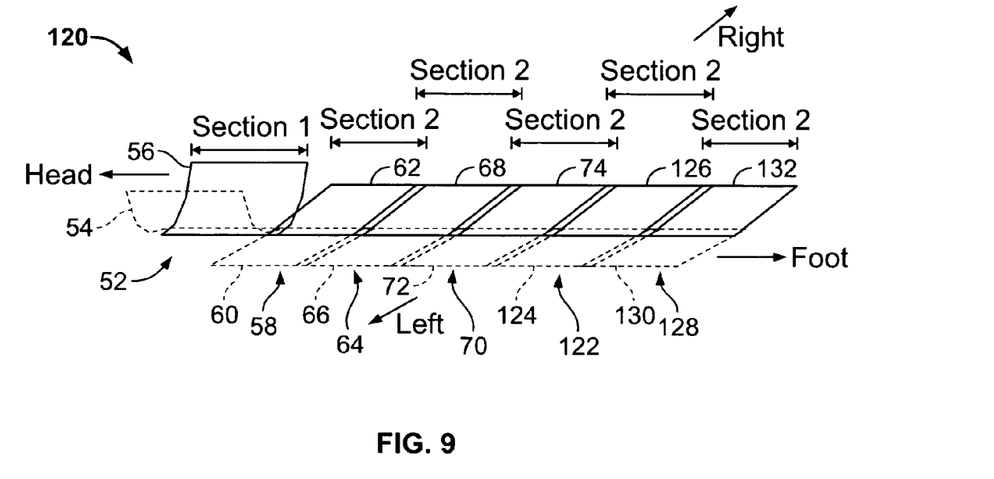
FIG. 9 is a schematic representation of a phased array coil in accordance with another exemplary embodiment of the invention.

In another exemplary embodiment, as shown in FIG. 9, a phased array coil 120 with twelve loop coils, for example, on the posterior former, is provided. The phased array coil 120 is similar to the phased array coil 50, but adds a fifth coil section 122 having loop coils 124 and 126, and a sixth coil section 128 having loop coils 130 and 132. The phased array coil 120 may be used in connection with a six or eight channel MRI system. It should be noted that the length in the HF direction of each coil section is shorter than that of the phased array coil 50 shown in FIG. 1. In operation, using any three or four of the coil sections provides a large FOV for spine scanning. For a six channel system, the first, second and third coil sections 52, 58 and 64 are jointly used for C-spine imaging; the second, third and fourth coil section 58, 64 and 70 are jointly used for T-spine imaging; and the fourth, fifth and sixth coil sections 70, 122 and 128 are jointly used for L-spine imaging. Also, any adjacent two coil sections can be jointly used to scan a specific spine region. For an eight-channel system, the first, second, third and fourth coil sections 52, 58, 64 and 70 are jointly used for C-spine imaging; the second, third, fourth and fifth coil sections 58, 64, 70 and 122 are jointly used for T-spine imaging; and the third, fourth, fifth and sixth coil sections 64, 70, 122 and 128 are jointly used for L-spine imaging. Also, any adjacent two or three coil sections can be jointly used to scan a specific spine region.

Figure 10:
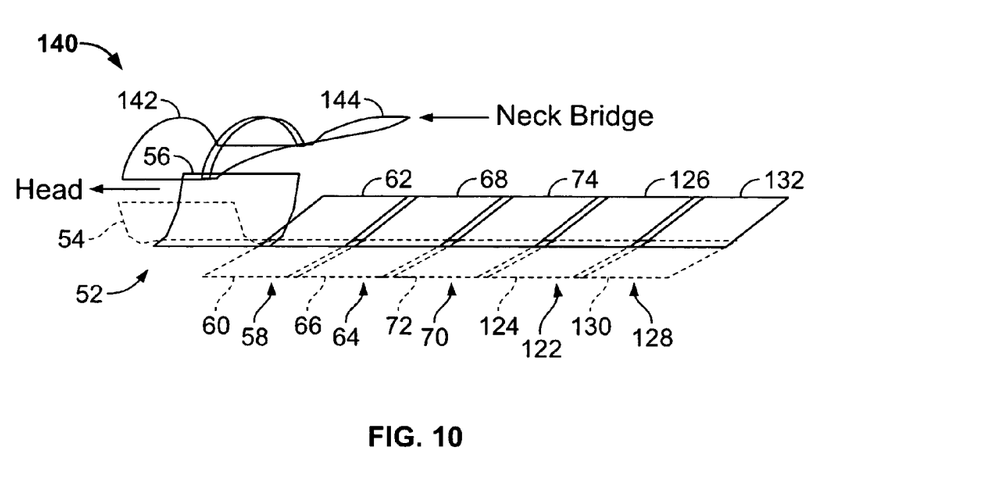
FIG. 10 is a schematic representation of a phased array coil in accordance with another exemplary embodiment of the invention.

In another exemplary embodiment, as shown in FIG. 10, a phased array coil 140 with twelve loop coils, for example, on the posterior former, is provided similar to the phased array coil 120 shown in FIG. 9, but with first and second neck bridge loop coils 142 and 144, for example, on the neck bridge (not shown). The phased array coil 140 may be used in connection with a six or eight channel MRI system. The first and second coil sections 52 and 58 and the first and second neck bridge loop coils 142 and 144 are jointly used for C-spine scanning in the six channel MRI system. The first, second and third coil sections 52, 58 and 64 may be jointly used for C-spine scanning in the eight channel system.

Figure 11:
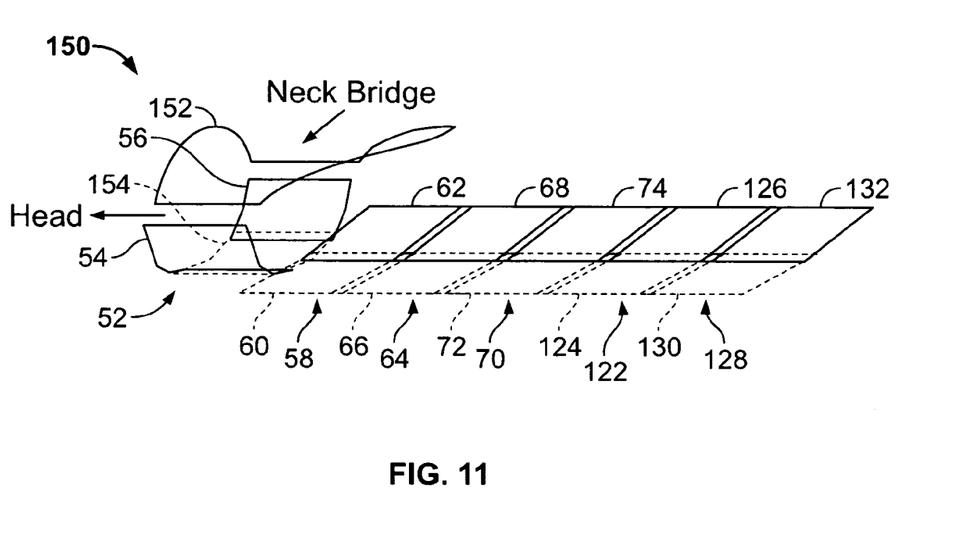
FIG. 11 is a schematic representation of a phased array coil in accordance with another exemplary embodiment of the invention.

In another exemplary embodiment, as shown in FIG. 11, a phased array coil 150 with thirteen loop coils, for example, on the posterior former, and one-loop coil 152 on the neck bridge (not shown) are provided. The phased array coil 150 is similar to the a phased array coil 140, but includes only one coil in the neck bridge and includes an additional loop coil 154 in the first coil section 52 between the first and second loop coils 54 and 56. The phased array coil 150 may be used in connection with a six or eight channel MRI system. In such a six channel system, the first and second coil sections 52 and 58, and the additional loop coil 154 in the neck bridge may be jointly used together for C-spine scanning. In an eight channel system, the first and second coil sections 52 and 58, and the additional loop coil 154 in the neck bridge may be jointly used together for C-spine scanning.

Figure 12:
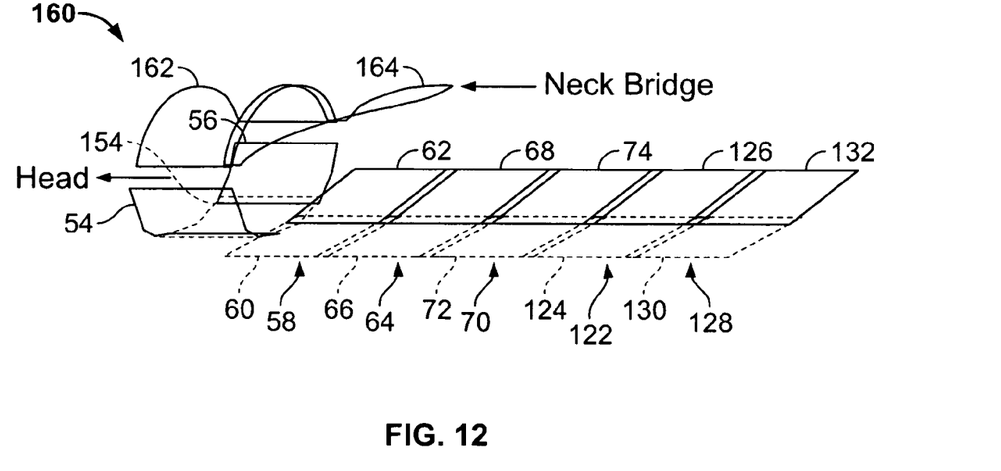
FIG. 12 is a schematic representation of a phased array coil in accordance with another exemplary embodiment of the invention.

In another exemplary embodiment, as shown in FIG. 12, a phased array coil 160 with thirteen loop coils on, for example, the posterior former is provided similar to the phased array coil 150, but with first and second neck bridge coils 162 and 164, for example, on the neck bridge (not shown). The phased array coil 160 may be used in connection with an eight channel MRI system. In such a system, the first and second coil sections 54 and 58, and the first and second neck bridge coils 162 and 164 may be jointly used for C-spine scanning.

Modifications to the various embodiments are contemplated. For example, the number of coil sections in the HF direction may be increased or decreased, as desired or needed, for example, based on the available number of receive channels of the MRI system in connection with which it is to be used. Further, and for example, a torso piece having several coil elements may be added to enhance penetration and add parallel imaging capability with phase encoding in the AP direction.

It should be noted that the phased array coils of the various embodiments may be tuned and matched to different frequencies. In this case, the values of the tuning capacitors (not shown and as are known) will change and the shifting distance for the coil from the center of the former to left or right side will also change to reduce the LR shading. Further, it should be noted that the feeding points of the coils can be placed in any location of the coil. Additionally, the matching of the coils may be provided via capacitive matching or inducting matching. Also, the resonating of the phased array coils of the various embodiments may be provided via direct feeding or inductive coupling. Depending on the MRI system, the phased array coils of the various embodiments may include pre-amplifiers.

Thus, various embodiments of the invention may provide for cervical, thoracic and lumbar spine scanning using a plurality of coil elements having an offset or shifted configuration. Imaging the spine in horizontal systems with a 3 T main magnetic field strength (or greater or lesser) may be provided. Spine imaging without or with reduced LR shading is provided. A uniform sensitivity area with high SNR in the LR direction to cover the spine and nearby tissue is also provided. Parallel imaging capability with phase encoding in the LR direction in addition to the HF directions further may be provided.

In operation, various embodiments of the invention provide acquired transverse and coronal images that are more symmetrical and uniform in the LR direction, for example, when used on 3 T or higher field MRI systems. High SNR in the spine area is also provided.

Further, various embodiments of the present invention provide for positioning two parallel loop coils in the LR direction and shift the loop coils to the left or right in order to provide a uniform sensitivity area with high SNR in the LR direction to cover the spine and nearby tissue. The center of the loop coils may be shifted to the left or right side according to the main magnetic field direction of the system in order to provide high SNR in the LR direction to cover the spine and nearby tissue. Also, two parallel loop coils may be positioned in the LR direction to make one section of the phased array coil, with several of these sections provided in the HF direction to construct a whole spine coil. Additionally, three parallel loop coils may be positioned in the LR direction around the neck and combine with several two-loop structure sections to construct a whole spine coil. Also, these arrangements may be combined with a neck bridge that includes one or two loop elements to provide a whole spine coil. An anterior torso piece having several loop elements also may be combined with these arrangements to provide a whole spine coil.

While the invention has been described in terms of various specific embodiments, those skilled in the art will recognize that the invention can be practiced with modification within the spirit and scope of the claims.

What is claimed is:

1. A phased array coil for a Magnetic Resonance Imaging (MRI) system, the phased-array coil comprising:
    a first coil; and
    a second coil adjacent the first coil, the first and second coils defining a coil array configured in a shifted arrangement from a center of examination of an object to be examined.

2. A phased array coil in accordance with claim 1 wherein the first and second coils are configured in a parallel arrangement.

3. A phased array coil in accordance with claim 2 wherein the first and second coils are positioned in the parallel arrangement in a left-right direction.

4. A phased array coil in accordance with claim 1 wherein the first and second coils are shifted one of left and right of the center of examination.

5. A phased array coil in accordance with claim 1 wherein the first and second coils are shifted between about fifteen percent and about twenty percent of a width of one of the first and second coils.

6. A phased array coil in accordance with claim 5 wherein the shift direction is based on a main magnetic field direction of the MRI system.

7. A phased array coil in accordance with claim 1 wherein the first and second coils comprise loop coils.

8. A phased array coil in accordance with claim 1 wherein the first and second coils are configured to form a coil section.

9. A phased array coil in accordance with claim 8 further comprising a plurality of additional coils configured to form a plurality of additional coil sections.

10. A phased array coil in accordance with claim 9 wherein the coil sections are aligned in a head-foot direction.

11. A phased array coil in accordance with claim 9 wherein the coil sections are configured to provide cervical-thoracic-lumbar (CTL) spine imaging with the MRI system.

12. A phased array coil in accordance with claim 1 wherein the first and second coils are configured in a curved arrangement conformal to a shape of a neck and a head.

13. A phased array coil in accordance with claim 1 further comprising a third coil positioned between the first and second coils.

14. A phased array coil in accordance with claim 1 further comprising at least one neck bridge coil.

15. A phased array coil in accordance with claim 1 wherein the first and second coils are configured in an overlapping arrangement.

16. A cervical-thoracic-lumbar (CTL) spine phased array coil for a Magnetic Resonance Imaging (MRI) system, the CTL spine phased array coil comprising:
    a plurality of coil sections aligned in a head-foot direction of the MRI system, each of the coil sections comprising at least two coils configured in a parallel arrangement in a left-right direction of the MRI system, and wherein the at least two coils of each coil section are shifted from a center of the left-right direction relative to a spine of a patient.

17. A CTL spine phased array coil in accordance with claim 16 wherein each of the at least two coils in each of the coil sections are shifted one of left and right of the center of the left-right direction based on a main magnetic field direction of the MRI system.

18. A CTL spine phased array coil in accordance with claim 16 wherein each of the at least two coils in each of the coil sections are shifted between about fifteen percent and about twenty percent of a width of one of the at least two coils.

19. A method of providing a phased array coil for a Magnetic Resonance Imaging (MRI) system, the method comprising:
    configuring at least two coils in each of a plurality of coil sections in a parallel arrangement in a left-right direction of the MRI system and
    shifting the at least two coils in each of the plurality of coil sections from a center in the left-right direction of an object.

20. A method in accordance with claim 19 wherein the shifting comprises shifting the at least two coils between about fifteen percent and about twenty percent of a width of one of the at least two coils.

* * * * *